United States Patent [19]

Pfeifer

[11] Patent Number: 4,629,777

[45] Date of Patent: Dec. 16, 1986

[54] POLYIMIDES, A PROCESS FOR THEIR PREPARATION AND THEIR USE

[75] Inventor: Josef Pfeifer, Therwil, Switzerland

[73] Assignee: Ciba-Geigy Corporation, Ardsley, N.Y.

[21] Appl. No.: 608,755

[22] Filed: May 10, 1984

[30] Foreign Application Priority Data

May 18, 1983 [CH] Switzerland ............... 2690/83
Oct. 12, 1983 [CH] Switzerland ............... 5571/83

[51] Int. Cl.[4] ............................................. C08G 69/26
[52] U.S. Cl. ................................. 528/353; 430/283; 430/325; 522/164; 528/125; 528/126; 528/128; 528/172; 528/185; 528/188; 528/229; 528/352
[58] Field of Search ............... 528/125, 126, 128, 172, 528/185, 188, 352, 353, 229; 522/164, DIG. 905; 430/283, 325

[56] References Cited

U.S. PATENT DOCUMENTS

| | | | |
|---|---|---|---|
| 4,390,665 | 6/1983 | Giles, Jr. .................... | 525/180 |
| 4,438,256 | 3/1984 | Ohta et al. ................. | 528/353 |
| 4,512,893 | 4/1985 | Makino et al. ............. | 528/353 |
| 4,520,075 | 5/1985 | Igarashi et al. ............ | 528/353 |
| 4,535,099 | 8/1985 | Lee et al. .................... | 528/353 |

FOREIGN PATENT DOCUMENTS

1962588 7/1970 Fed. Rep. of Germany .

Primary Examiner—Lucille M. Phynes
Attorney, Agent, or Firm—Luther A. R. Hall; Michael W. Glynn

[57] ABSTRACT

Homopolyimides and copolyimides of aromatic tetracarboxylic acids and aromatic diamines which are substituted in the two ortho-positions relative to at least one N atom by alkyl, alkoxy, alkoxyalkyl, cycloalkyl or aralkyl, are soluble in organic solvents and have increased glass transition temperatures and hence very good heat stabilities. Such polyimides, which contain radicals of a benzophenonetetracarboxylic acid, are radiation-sensitive and autophotocrosslinkable. The polyimides are suitable for the production of films, protective coatings and photographic relief images.

29 Claims, No Drawings

POLYIMIDES, A PROCESS FOR THEIR PREPARATION AND THEIR USE

The present invention relates to homopolyimides and copolyimides of aromatic tetracarboxylic acids and diamines, at least 5 mol % of the diamines being aromatic diamines which are substituted in the two ortho-positions relative to at least one N atom by alkyl, cycloalkyl, alkoxy, alkoxyalkyl or aralkyl, a process for their preparation and their use for the production of protective films or photographic relief images, if at least 5 mol % of benzophenonetetracarboxylic acid radicals are present in the polyimide, based on the tetracarboxylic acids present.

Polyimides are plastics with useful thermomechanical properties. However, because of their high melting point ranges, they cannot be processed by the conventional shaping processes for thermoplastics. Soluble polyimides which can be used as lacquers for forming coating layers of high heat stability have therefore been developed, cf. German Auslegeschrift No. 1,962,588 and U.S. Pat. No. 3,787,367. With the development of electronics and semiconductor technology, particularly high requirements in respect of heat stability are imposed on polyimides, for example as insulating and protective films, which the known polyimides are not always capable of fulfilling.

It has now been found that soluble polyimides with increased heat stability are obtained if at least one aromatic diamine which is substituted in the two ortho-positions relative to at least one $NH_2$ group is used. It has furthermore been found that such polyimides are auto-photocrosslinkable under the influence of radiation if they contain at least 5 mol % of benzophenonetetracarboxylic acid radicals.

The invention relates to homopolyimides and copolyimides of at least one aromatic tetracarboxylic acid and at least one aromatic diamine, which essentially consist of 5 to 100 mol % of at least one structural element of the formula I

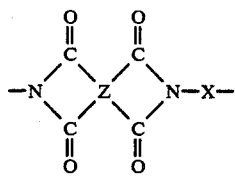

and 95-0 mol % of at least one structural element of the formula II

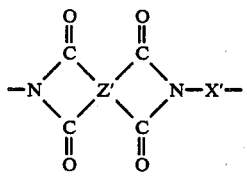

wherein Z is an unsubstituted or substituted tetravalent aromatic radical to which in each case two carbonyl groups are bonded in the ortho- or peri-position, X is the divalent radical or an aromatic diamine, Z' has the same meaning as Z, or is a different tetravalent organic radical to Z, and X' is the divalent radical of an organic diamine which differs from X, wherein the aromatic radical of X is substituted in the two ortho-positions relative to at least one N atom by alkyl, cycloalkyl, alkoxy, alkoxyalkyl or aralkyl, or wherein two adjacent C atoms of the aromatic radical are substituted by alkylene.

The homopolyimides and copolyimides preferably contain the structural elements of the formula I in an amount of 20-100 mol %, in particular 50-100 mol % and especially 80-100 mol %, and the structural elements of the formula II in an amount of 80 to 0 mol %, in particular 50 to 0 mol % and especially 20 to 0 mol %.

An aromatic radical X is preferably a divalent, mononuclear or dinuclear phenylene radical. A linear or branched alkyl or alkoxy substituent of X can contain 1 to 20, preferably 1 to 6 and in particular 1 to 4, C atoms, a linear or branched alkoxyalkyl substituent of X can contain 2 to 12, in particular 2 to 6, C atoms, an alkylene substituent of X can contain 3 or 4 C atoms, a cycloalkyl substituent of X can contain 5 to 8, in particular 5 or 6, ring carbon atoms and an aralkyl substituent of X can contain 7 to 12 C atoms. Alkoxyalkyl is preferably alkoxymethyl and aralkyl is preferably benzyl.

Examples of substituents are: methyl, ethyl, propyl, isopropyl, n-butyl, isobutyl, tert.-butyl, pentyl, hexyl, octyl, dodecyl, tetradecyl, eicosyl, cyclopentyl, cyclohexyl, methylcyclohexyl, methoxy, ethoxy, propoxy, butoxy, pentoxy, hexoxy, methoxymethyl, methoxyethyl, ethoxymethyl, propoxymethyl, butoxymethyl, benzyl, methylbenzyl and phenethyl. Preferred radicals are methoxymethyl, ethoxymethyl, methyl, ethyl, isopropyl, trimethylene and tetramethylene. Particularly preferred radicals are isopropyl, ethyl and, especially, methyl.

A substituted aromatic radical X can contain 8 to 30, in particular 8 to 25, C atoms. The aromatic radical is preferably a pyridine radical or, in particular, a hydrocarbon radical which is substituted by alkyl, alkoxyalkyl, alkoxy, trimethylene or tetramethylene. The aromatic radical can contain other substituents, for example halide, such as Cl or Br. In a preferred sub-group, mononuclear aromatic radicals are phenylene radicals and dinuclear aromatic radicals are naphthylene or bisphenylene radicals.

A preferred sub-group of polyimides according to the invention are those in which an aromatic radical X has the formulae III, IIIa and/or IIIb

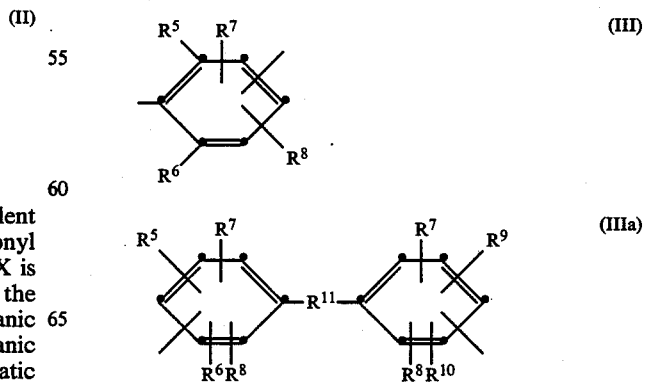

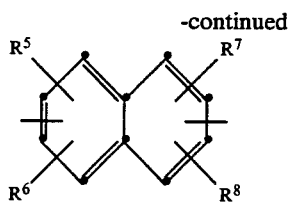

in which, in formula III, the free bonds are in the meta- or para-position relative to one another, in formula IIIa the free bonds are preferably in the meta- or para-position relative to the $R^{11}$ group and $R^5$ and $R^6$ are bonded in the two ortho-positions of the free bond, and in formula IIIb the free bonds are in the 2-, 3-, 6- or 7-positions and $R^5$ and $R^6$ are in the two ortho-positions of the free bonds, $R^{11}$ is a direct bond, —O—, —S—, —SS—, —SO—, —SO$_2$—, —CO—, —COO—, —NH—,

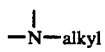

with 1 to 6 C atoms in the alkyl,

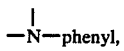

—CONH—, —CON—alkyl— with 1 to 6 C atoms in the alkyl, —CON—phenyl—, —CON—benzyl—,

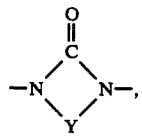

in which Y is

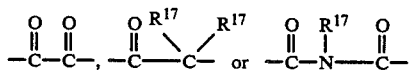

and $R^{17}$ is a hydrogen atom, $C_1$-$C_6$-alkyl or phenyl, linear or branched alkylene with 1 to 3 C atoms, alkylidene which has 2 to 12 C atoms and is unsubstituted or substituted by Cl or F, cycloalkylidene with 5 or 6 ring carbon atoms, phenylene, phenylenedioxy or the group $R^3SiR^4$,

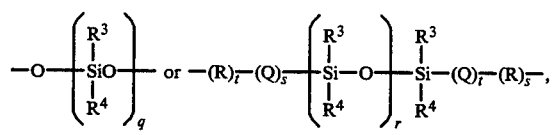

in which $R^3$ and $R^4$ are alkyl or alkoxy with 1 to 6 C atoms, phenyl, benzyl, phenoxy or benzyloxy, r is a number from 1 to 10, t is 0 or 1, s is 0 or 1, R is —O— or —S—, Q is $C_1$-$C_6$-alkylene and q is a number from 1 to 100, $R^5$ and $R^6$ are alkyl, or alkoxy with 1 to 12 C atoms, alkoxyalkyl with 2 to 12 C atoms, cyclopentyl, cyclohexyl or benzyl, or, in the formula III or IIIa, $R^5$ and $R^7$ are bonded in adjacent positions and together are trimethylene or tetramethylene, in which case $R^6$ can also be a hydrogen atom, or $R^7$ and $R^8$ are hydrogen atoms or independently have the meanings of $R^5$ and $R^6$, and $R^9$ and $R^{10}$ are hydrogen atoms or independently have the meanings of $R^5$ and $R^6$, or $R^7$ and $R^9$ in formula IIIa together are trimethylene or tetramethylene. $R^5$ and $R^6$ are preferably alkyl with 1 to 6 C atoms, in particular methyl, ethyl, n-propyl or isopropyl. The free bonds of the formula IIIa are preferably in the meta-position or, in particular, para-position relative to the $R^{11}$ group. The alkyl in the $R^{11}$ radicals can be, for example, methyl, ethyl, propyl, isopropyl, n-butyl or pentyl. An alkylene radical $R^{11}$ is preferably ethylene or, in particular, methylene. An alkylidene radical $R^{11}$ preferably contains 2 to 6 C atoms. Examples are ethylidene, 2,2-butylidene, 2,2- or 3,3-pentylidene, hexafluoropropylidene and, in particular, 2,2-propylidene. A cycloalkylidene radical $R^{11}$ can be, for example, cyclopentylidene or, in particular, cyclohexylidene. The $R^{11}$ group is preferably a direct bond, —O—, —S—, —SO$_2$—, —CO—, alkylene or alkylidene. $R^{11}$ is particularly preferably a direct bond, —O— or, in particular, —CO— or —CH$_2$—. $R^3$ and $R^4$ are preferably alkyl, in particular methyl or phenyl. R is preferably —O—, Q is preferably methylene or ethylene, q is preferably a number from 1 to 10 and r is a number from 1 to 20, in particular 1 to 10.

Another group of diamine radicals are those of the formula

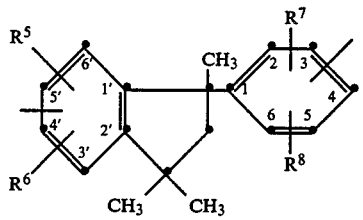

in which one free bond is in the 4'- or 5'-position and the other is in the 3-, 5- or, preferably, 4-position and $R^5$ and $R^6$ and/or $R^7$ and $R^8$ are in the ortho-positions of the free bond and are alkyl or alkoxy with 1 to 12 C atoms or alkoxyalkyl with 2 to 12 C atoms.

A particularly preferred sub-group of polyimides according to the invention are those in which X in formula I is a radical of the formula

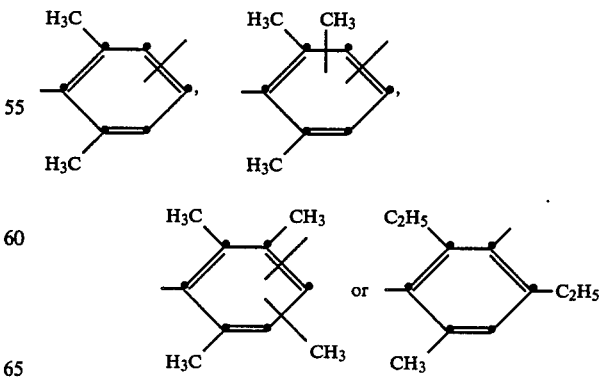

in which the free bonds are in the meta- or para-position relative to one another, or of the formula

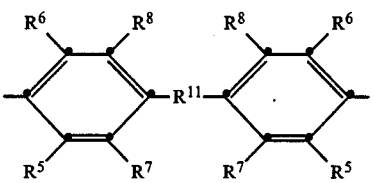

in which $R^5$ and $R^6$ independently of one another are methyl, ethyl, n-propyl or isopropyl, $R^7$ and $R^8$ are hydrogen atoms or have the meaning of $R^5$, or $R^5$ and $R^7$ together are trimethylene or tetramethylene and $R^6$ and $R^8$ are hydrogen atoms, and $R^{11}$ is a direct bond, $CH_2$, 2,2-propylidene or CO. Of these dinuclear radicals, those in which $R^5$, $R^6$, $R^7$ and $R^8$ are methyl are particularly preferred. Copolyimides which contain at least 2 different radicals of these formulae are a further preferred embodiment of the invention.

Copolyimides according to the invention contain at least two different structural elements, the number of different structural elements essentially depending on the desired properties and the field of use. They preferably contain 2 to 4 different structural elements, in which case the structural elements may differ only in the radical X in the formula I. In a particularly preferred embodiment of such copolyimides, the polymers contain structural elements of ortho-disubstituted phenylenes, in particular of 1,3-phenylenes.

Examples of X are: 2,6-dimethyl-1,4- or -1,3-phenylene, 2,6-diethyl-1,4- or -1,3-phenylene, 2,6-dimethyl-5-chloro-1,4- or -1,3-phenylene, 2-methyl-6-ethyl-1,4- or -1,3-phenylene, 2-methyl-6-isopropyl-1,4- or -1,3-phenylene, 2,6-diisopropyl-1,4- or -1,3-phenylene, 2,6-dimethoxy-1,4- or -1,3-phenylene, 2,6-diethoxy-1,4- or -1,3-phenylene, 2-methyl-6-methoxy-1,4- or -1,3-phenylene, 2,6-dibenzyl-1,4- or -1,3-phenylene, 2,6-dimethoxymethyl-1,4- or -1,3-phenylene, 2,5,6-trimethyl-1,4- or -1,3-phenylene, 2,5,6-triethyl-1,4- or -1,3-phenylene, 2,4,6-trimethyl-1,3-phenylene, 2,3,5,6-tetramethyl-1,4-phenylene, 2,4,5,6-tetramethyl-1,3-phenylene, tetrahydro-1,4- or -1,3-naphthylene and radicals of the formulae

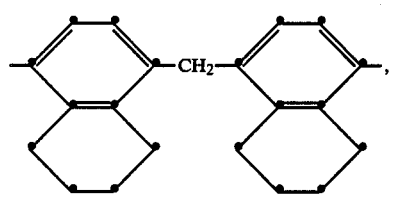

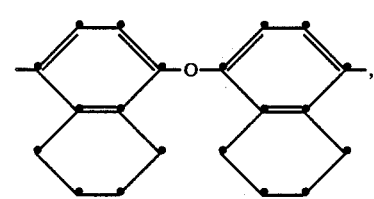

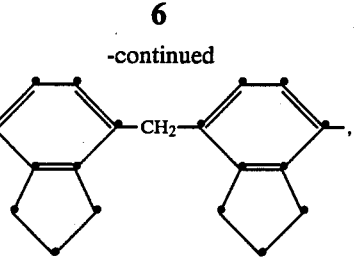

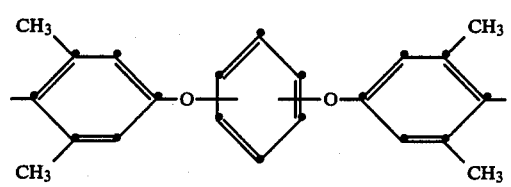

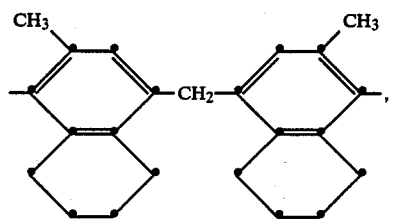

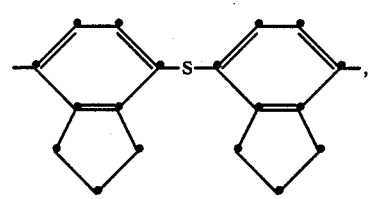

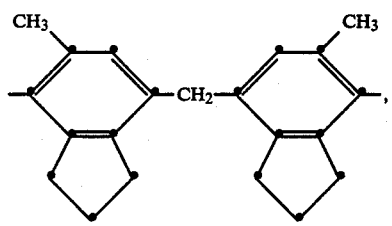

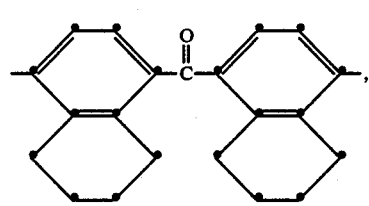

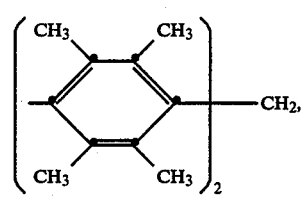

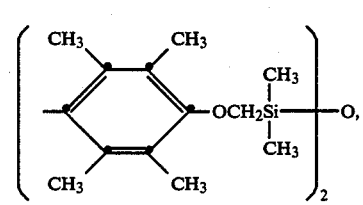

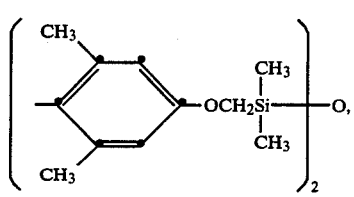

as well as

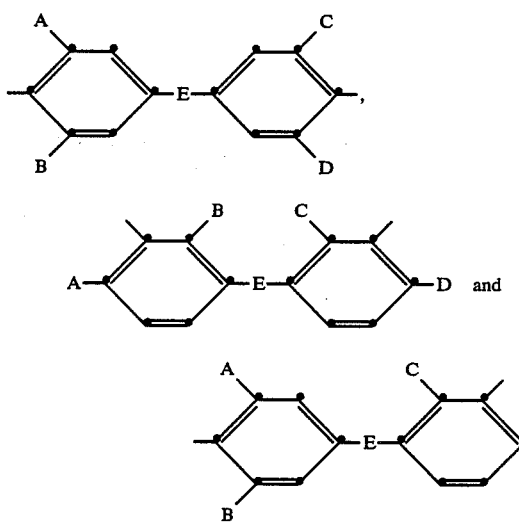

in which A, B, C, D and E have the meanings given in the table which follows. The free positions in the phenyl nuclei can be occupied by one or two other substituents G or H in each nucleus, it being possible for G or H to have the meaning given in the following table:

| E | A | B | C | D |
|---|---|---|---|---|
| CH$_2$ | Methyl | Methyl | H | H |
| CH$_2$ | Methyl | Ethyl | H | H |
| CH$_2$ | Ethyl | Ethyl | H | H |
| CH$_2$ | Isopropyl | Isopropyl | H | H |
| CH$_2$ | Methoxymethyl | | H | H |
| CH$_2$ | Benzyl | Benzyl | H | H |
| CH$_2$ | Methyl | Methyl | Methyl | H |
| CH$_2$ | Ethyl | Ethyl | Ethyl | H |
| CH$_2$ | Isopropyl | Isopropyl | Methyl | H |
| CH$_2$ | Methoxymethyl | | Methyl | H |
| CH$_2$ | Methyl | Ethyl | Methyl | H |
| CH$_2$ | Methoxymethyl | | | Methoxymethyl |
| CH$_2$ | Methyl | Methyl | Methyl | Methyl |
| CH$_2$ | Ethyl | Ethyl | Ethyl | Ethyl |
| CH$_2$ | Methyl | Methyl | Ethyl | Ethyl |
| CH$_2$ | Ethyl | Ethyl | Isopropyl | Isopropyl |
| CH$_2$ | Isopropyl | Isopropyl | Isopropyl | Isopropyl |
| CH$_2$ | Isopropyl | Isopropyl | Methyl | H |
| CH$_2$ | Methoxy | Methoxy | Methyl | Methyl |
| O | Methyl | Methyl | H | H |
| O | Ethyl | Ethyl | H | H |
| O | Methyl | Methyl | Methyl | H |
| O | Methyl | Methyl | Methyl | Methyl |
| O | Methyl | Methyl | Ethyl | Ethyl |
| S | Methyl | Methyl | H | H |
| S | Ethyl | Ethyl | H | H |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | H | H |
| CO | Methyl | Methyl | H | H |
| CO | Methyl | Methyl | Methyl | Methyl |
| SO$_2$ | Methyl | Methyl | Ethyl | H |
| SO$_2$ | Methyl | Methyl | H | H |
| SO$_2$ | Methyl | Methyl | Methyl | Methyl |
| SO$_2$ | Ethyl | Ethyl | Methyl | Methyl |
| SO | Methyl | Methyl | Methyl | Methyl |
| SO | Methyl | Methyl | H | H |
| COO | Methyl | Methyl | H | H |
| COO | Methyl | Methyl | Methyl | Methyl |
| CONCH$_3$ | Methyl | Methyl | H | H |
| NCH$_3$ | Methyl | Methyl | Ethyl | Ethyl |
| NCH$_3$ | Methyl | Methyl | Methyl | Methyl |
| CONH | Methyl | Methyl | — | — |
| NH | Ethyl | Methyl | Ethyl | Methyl |
| NH | Methyl | Methyl | Methyl | Methyl |
| Si(Methyl)$_2$ | Methyl | Methyl | H | H |
| Si(Phenyl)$_2$ | Methyl | Methyl | Methyl | Methyl |
| Si(OMethyl)$_2$ | Ethyl | Ethyl | H | H |
| Si(OPhenyl)$_2$ | Methyl | Methyl | Methyl | Methyl |
| —OSi(Methyl)$_2$O— | Methyl | Methyl | Methyl | Methyl |
| Ethylene | Methyl | Methyl | H | H |
| Ethylene | Methyl | Methyl | Methyl | Methyl |
| Ethylene | Ethyl | Ethyl | H | H |
| Ethylene | Methyl | Methyl | Ethyl | Ethyl |
| Phenylene | Methyl | Methyl | Methyl | Methyl |
| Phenylene | Ethyl | Ethyl | H | H |
| (CH$_3$)$_2$C< | Methyl | Ethyl | Methyl | Ethyl |
| (CH$_3$)$_2$C< | Methyl | Methyl | Methyl | Methyl |
| (CF$_3$)$_2$C< | Methyl | Methyl | Methyl | Methyl |
| direct bond | Methyl | Methyl | H | H |
| direct bond | Methyl | Ethyl | Methyl | Ethyl |
| direct bond | Methyl | Ethyl | Methyl | H |
| direct bond | Ethyl | Ethyl | Ethyl | Ethyl |
| direct bond | Methoxy | Methoxy | Methoxy | Methoxy |
| direct bond | Isopropyl | Isopropyl | H | H |
| direct bond | Methoxymethyl | Methoxymethyl | Methoxymethyl | Methoxymethyl |

The diamines from which X is derived are known or can be prepared by known processes. Si-containing diamines are described in U.S. Pat. No. 3,435,002 and European Pat. No. A-0,054,426. Diamines with the

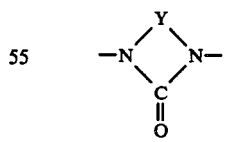

group can be prepared from the diisocyanates described in German Offenlegungsschrift No. 2,318,170. Diamines substituted by alkyl or cycloalkyl, in particular ethyl or propyl, are accessible by alkylation of unsubstituted or partly substituted aromatic diamines with alkenes or cycloalkenes (cf. U.S. Pat. No. 3,275,690). Polynuclear, in particular dinuclear, aromatic diamines are obtainable via condensation of corresponding monoamines with aldehydes or ketones.

X' in the structural element of the formula II can be linear or branched alkylene with 7 to 30 C atoms, cycloalkylene with 5 to 8 ring carbon atoms, aralkylene with 7 to 30 C atoms, arylene with 6 to 22 C atoms and/or a polysiloxane radical.

A divalent aliphatic radical X' in formula I preferably contains 6 to 30, in particular 6 to 20, C atoms. In a preferred sub-group, X' is linear or branched alkylene, which can be interrupted by oxygen atoms, NH, NR$^a$, ⊕NR$_2^a$G⊖, cyclohexylene, naphthylene, phenylene or hydantoin radicals. R$^a$ can be, for example, alkyl with 1 to 12 C atoms, cycloalkyl with 5 or 6 ring C atoms, phenyl or benzyl. G⊖ is an anion of a protic acid, for example halide, sulfate or phosphate. In a preferred embodiment, R and/or R' are linear or branched alkylene with 6 to 30 C atoms, —(CH$_2$)$_m$—R$^{13}$—(CH$_2$)$_n$— in which R$^{13}$ is phenylene, naphthylene, cyclopentylene or cyclohexylene and m and n independently of one another are the number 1, 2 or 3, —R$^{14}$+OR$^{15}$+O—R$^{14}$—, in which R$^{14}$ is ethylene, 1,2-propylene, 1,3-propylene or 2-methyl-1,3-propylene, R$^{15}$ is ethylene, 1,2-propylene, 1,2-butylene, 1,3-propylene or 1,4-butylene and p is a number from 1 to 100, or

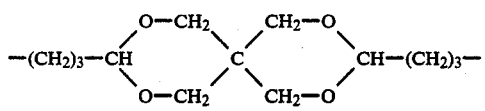

Examples of aliphatic radicals are: methylene, ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes and eicosylenes, 2,4,4-trimethylhexylene, 1,10-dialkyldecylene, in which the alkyl preferably has 1 to 6 C atoms, substituted 1,11-undecylenes, for example those described in European Pat. No. B-0,011,559, radicals of Jeffamines, for example

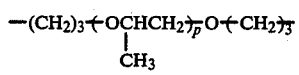

in which p is 1 to 100 or —(CH$_2$)$_3$(O(CH$_2$)$_4$)$_p$O—(CH$_2$)$_3$, in which p is 1–100, dimethylenecyclohexane, xylylene and diethylenebenzene.

The aliphatic radicals interrupted by heterocyclic radicals can be, for example, those which are derived from N,N'-aminoalkylated hydantoins or benzimidazoles. Examples are N,N'-(γ-aminopropyl)-5,5-dimethyl-hydantoin or -benzimidazolone and those of the formula

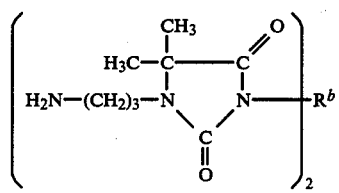

in which R$^b$ is alkylene with 1 to 12, preferably 1 to 4, C atoms or

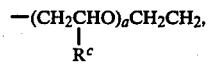

in which R$^c$ is a hydrogen atom or methyl and a is an integer from 1 to 20.

Examples of suitable substituents for the aliphatic radicals are hydroxyl, halide, such as F or Cl, or alkoxy with 1 to 6 C atoms.

A divalent cycloaliphatic radical X' in formula I preferably contains 5 to 8 ring C atoms and is, in particular, mononuclear or dinuclear cycloalkylene which has 5 to 7 ring C atoms and is unsubstituted or substituted by alkyl, which preferably contains 1 to 4 C atoms. In a preferred embodiment, a cycloaliphatic radical X' is a radical of the formula

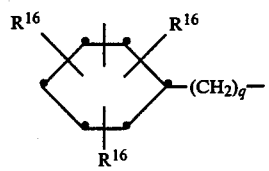

or

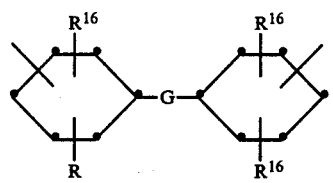

in which q is 0 or 1, the radicals R$^{16}$ independently are hydrogen or alkyl with 1 to 6 C atoms and G is a direct bond, O, S, SO$_2$, alkylene with 1 to 3 C atoms or alkylidene with 2 to 6 C atoms. R$^{16}$ is preferably ethyl or methyl, G is preferably methylene and the alkylidene preferably contains 2 or 3 C atoms, and is, for example, ethylidene or 1,1- or 2,2-propylidene.

Examples of a cycloalkylene radical X' are: 1,2- or 1,3-cyclopentylene, 1,2-, 1,3- or 1,4-cyclohexylene, cycloheptylene, cyclooctylene, methylcyclopentylene, methyl- or dimethyl-cyclohexylene, 3- or 4-methylenecyclohex-1-yl, 5-methyl-3-methylenecyclohex-1-yl, 3,3'- or 4,4'-bis-cyclohexylene, 3,3'-dimethyl-4,4'-biscyclohexylene and 4,4'-bis-cyclohexylene ether, sulfone, -methane or -2,2-propane, and the radicals of bis-aminomethyltricyclodecane, bis-amino-methylnorbornane and menthanediamine.

A cycloaliphatic radical X' is particularly preferably 1,4- or 1,3-cyclohexylene, 2,2,6-trimethyl-6-methylenecyclohex-4-yl, methylenebis(cyclohex-4-yl) or methylenebis(3-methylcyclohex-4-yl).

An araliphatic radical X' preferably contains 7 to 30 C atoms. The aromatic groups are preferably substituted in the same manner as an aromatic radical X', including the preferred substitutions, but are at least monosubstituted, preferably in the ortho-position relative to the N atom. The araliphatic radical contains, in particular, 8 to 26 C atoms. The aromatic radical in the araliphatic radical is preferably a phenyl radical. An araliphatic radical X' is, in particular, aralkylene which is unsubstituted or substituted on the aryl by alkyl, the alkylene radical being linear or branched. In a preferred embodiment, the araliphatic radical corresponds to the formula

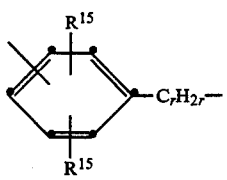

in which the radicals $R^{15}$ independently of one another are hydrogen atoms or, in particular, alkyl with 1-6 C atoms and r is an integer from 1 to 20.

The free bond is preferably in the m-position or p-position relative to the $C_rH_{2r}$ group and one or both of the radicals $R^{15}$ are preferably bonded in the o-position relative to the free bond.

Examples of an araliphatic radical X' are: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylenepropylene, p-phenylenebutylene, 3-ethyl-p-phenylenepentylene and, in particular, longer-chain phenylenealkylene radicals, which are described, for example, in European Pat. No. A-0,069,062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyl-dodec-1-yl and 13-(p-phenylene)-2,12-dimethyltetradec-3-yl.

An arylene radical X' preferably contains 6 to 22 C atoms. The arylene is, in particular, a mononuclear or dinuclear phenylene radical. The arylene can be substituted, for example by alkyl or alkoxy with 1 to 6 C atoms, alkoxymethyl with 2 to 6 C atoms and/or halogen, such as F or Cl. Substituted aromatic radicals are preferred, since such copolyimides are in general more soluble. 1,3-Phenylenes which are substituted in one ortho-position relative to the free bond by alkyl with 1 to 4 C atoms, in particular methyl, are furthermore preferred.

In one embodiment, X' has the formula IV

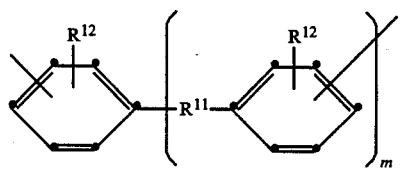

(IV)

in which m is 0 or 1, the free bonds are in the meta-position or, preferably, the ortho-position relative to the $R^{12}$ group, $R^{11}$ is as defined in formula IIIa and $R^{12}$ has the same meaning as $R^5$.

A preferred sub-group are arylene radicals of the formula IVa, IVb or IVc

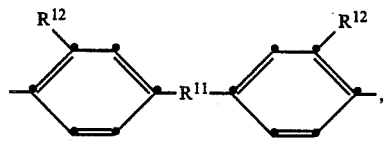

(IVa)

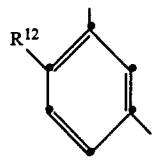

(IVb)

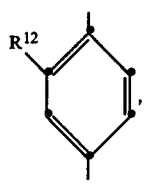

(IVc)

in which $R^{11}$ is a direct bond, —O—, —CO— or —CH$_2$— and $R^{12}$ is methyl, ethyl, isopropyl, methoxy, ethoxy or a hydrogen atom.

Examples of diamines HN—X'—NH$_2$ with an aromatic radical are: 4,4'-methylenebis-(o-chloroaniline), 3,3'-dichlorobenzidine, 3,3'-sulfonyldianiline, 4,4'-diaminobenzophenone, 1,5-diaminonaphthalene, bis-(4-aminophenyl)-dimethylsilane, bis-(4-aminophenyl)-diethylsilane, bis-(4-aminophenyl)-diphenylsilane, bis-(4-aminophenyloxy)-dimethylsilane, bis-(4-aminopheny)-ethylphosphine oxide, N-[bis-(4-aminophenyl)]-N-methylamine, N-[bis-(4-aminophenyl)]-N-phenylamine, 4,4'-methylenebis-(3-methylaniline), 4,4'-methylenebis-(2-ethylaniline), 4,4'-methylenebis-(2-methoxyaniline), 5,5'-methylenebis-(2-aminophenol), 4,4'-methylenebis-(2-methylaniline), 4,4'-oxybis-(2-methoxyaniline), 4,4'-oxybis-(2-chloroaniline), 5,5'-oxybis-(2-aminophenol), 4,4'-thiobis-(2-methylaniline), 4,4'-thiobis-(2-methoxyaniline), 4,4'-thiobis-(2-chloroaniline), 4,4'-sulfonylbis-(2-methylaniline), 4,4'-sulfonylbis-(2-ethoxyaniline), 4,4'-sulfonylbis-(2-chloroaniline), 5,5'-sulfonylbis-(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-oxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine, diaminotoluene, 4,4'-methylene-bis-(3-carboxyaniline) and esters thereof, and 5-amino-1-(4-aminophenyl)-1,3,3-trimethylindane.

X' can also be a divalent radical containing siloxane groups. This can have the formula

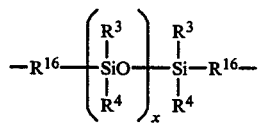

in which X is a rational number of at least 1, $R^3$ and $R^4$ are as defined above and $R^{16}$ is a divalent hydrocarbon radical, for example alkylene with 1 to 12, preferably 1 to 6, C atoms, cycloalkylene with preferably 5 or 6 ring carbon atoms or phenylene. $R^3$ and $R^4$ are preferably methyl or phenyl and X is preferably a number from 1 to 1,000, in particular 1 to 100 and especially 1–10. Examples of alkylene are ethylene, 1,3- or 1,2-propylene and 1,3- or 1,4-butylene. Diamines containing this group X' are described in U.S. Pat. No. 4,030,948. Other suitable diamines with a group X' containing siloxane groups are described in U.S. Pat. No. 3,435,002 and European Pat. No. A-0,054,426.

It is known that some aliphatic and aromatic diamines, for example phenylenediamine or di(aminophenyl)methane, can favour the insolubility of polyimides. Such diamines are therefore preferably used in relatively small amounts. In this case, in particular, the polyimides contain at least 50 mol %, in particular 80 mol % and especially 90 mol %, of structural elements of the formula I.

A divalent aromatic radical Z or Z' preferably contains 6 to 30, in particular 6 to 20, C atoms. In a preferred sub-group, Z and Z' have the formulae

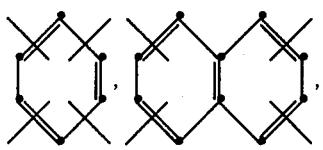,

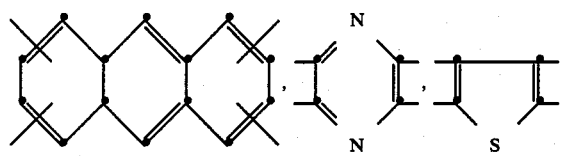,

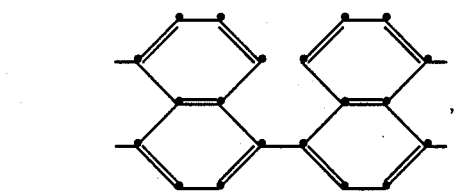,

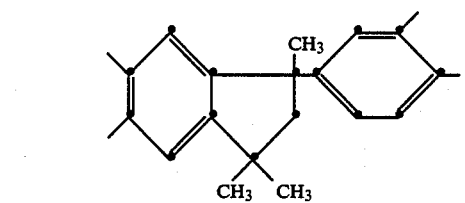

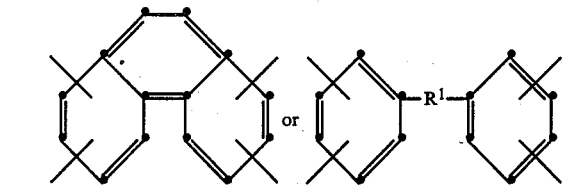

in which $R^1$ is a direct bond or a bridge group of the formula

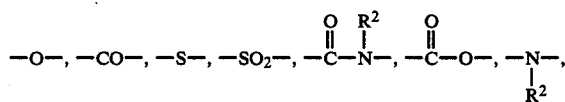

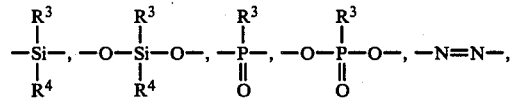

-continued $$-N=N-,\ -NH-,\ \underset{O}{\overset{O}{\underset{\|}{-C}}}-\overset{H}{\underset{|}{N}}-,\ -CH_2-,\ -CH_2CH_2-,$$

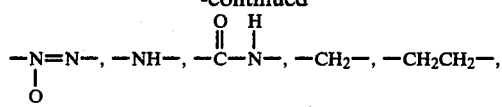

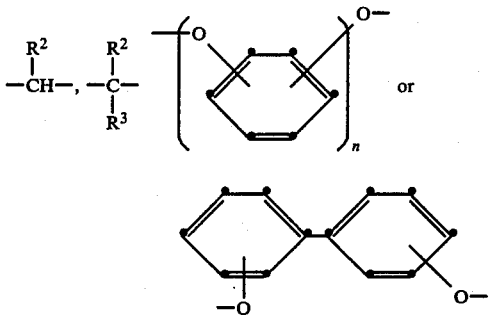

in which $R^2$, $R^3$ and $R^4$ are alkyl with 1 to 6 C atoms, phenyl or benzyl, and $R^3$ and $R^4$ are alkoxy with 1 to 6 C atoms, phenoxy or benzyloxy.

In the above formulae, in each case two of the free bonds are always in the peri- and/or ortho-position.

A preferred sub-group for Z and Z' are radicals of the formulae

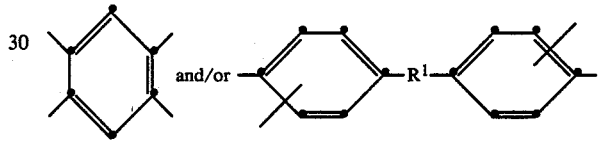

in which $R^1$ is a direct bond, —O—, —SO$_2$—, —CH$_2$— or, in particular, —CO—.

Radicals of the formulae

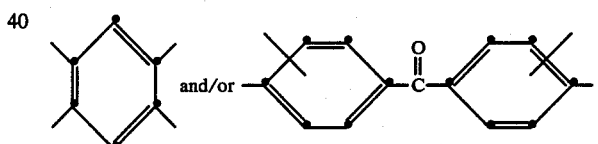

or mixtures thereof, for example those with at least 5 mol % of tetravalent benzophenone radicals, are very particularly preferred. The free bonds in the benzophenone radical are in the ortho-position.

Examples of tetracarboxylic acid anhydrides with a radical Z or Z' are: 2,3,9,10-perylenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, pyromellitic dianhydride, 3,3',4,4'-biphenyltetracarboxylic acid dianhydride, 2,2',3,3+-biphenyltetracarboxylic acid dianhydride, 4,4'-isopropylidenediphthalic anhydride, 3,3'-isopropylidenediphthalic anhydride, 4,4'-oxydiphthalic anhydride, 4,4'-sulfonyldiphthalic anhydride, 3,3'-oxydiphthalic anhydride, 4,4'-methylenediphthalic anhydride, 4,4'-thiodiphthalic anhydride, 4,4'-ethylidenediphthalic anhydride, 2,3,6,7-naphthalenetetracarboxylic acid dianhydride, 1,2,4,5-naphthalenetetracarboxylic acid dianhydride, 1,2,5,6-naphthalenetetracarboxylic acid dianhydride, benzene-1,2,3,4-tetracarboxylic acid dianhydride, thiophene-2,3,4,5-tetracarboxylic acid dianhydride, 1-(3',4'-dicarboxyphenyl)-1,3,3-trimethylindane-5,6-dicarboxylic acid dianhydride, 1-(3',4'-dicarboxyphenyl)-1,3,3-trimethylindane-6,7-dicarboxylic acid dianhydride, 1-(3',4'-dicarboxyphenyl)-3-methylindane-5,6-dicarboxylic acid dianhydride, 1-(3',4'-dicarboxyphenyl)-3-methylindane-6,7-dicarboxylic acid dianhydride, 3,3',4,4'-benzophenonetetracarboxylic acid anhydride and 4,5,3',4'-benzophenonetetracarboxylic acid anhydride.

The polyimides according to the invention have average molecular weights (weight-average $\overline{M}w$) of at least 2,000, preferably at least 5,000. The upper limit essentially depends on properties which determine the processability, for example the solubility of the polyimides. It can be up to 500,000, preferably up to 100,000 and in particular up to 60,000. The polymers can furthermore be random polyimides or block polyimides. They are prepared by customary processes in equipment envisaged for this purpose.

The present invention furthermore relates to a process for the preparation of polyimides with structural elements of the formula I and/or II, which comprises subjecting at least one tetracarboxylic acid of the formula V

by itself or together with at least one tetracarboxylic acid of the formula Va, or polyimide-forming derivatives thereof,

to a polycondensation reaction with at least 5 mol %, based on the diamines, of at least one diamine of the formula VI

by itself or together with at most 95 mol % of at least one diamine of the formula VIa

and then cyclising the product, in a manner which is known per se, and . . . the polyimides which can be obtained by this process, in particular those with at least 5 mol % of structural elements of the formula I in which Z is the tetravalent radical of a benzophenonetetracarboxylic acid anhydride. Instead of the tetracarboxylic acids, it is also possible to use polyimide-forming derivatives thereof, for example their esters, amides, halides, in particular the chlorides, and anhydrides.

The starting compounds are known and are commercially available or can be prepared by known processes. The reaction is advantageously carried out in solution; suitable inert solvents are mentioned below. The reaction temperatures can be −20° to 300° C.

Specifically, a procedure is advantageously followed in which the tetracarboxylic acid dianhydride and the diamine are first reacted to form a polyamide acid intermediate and this polyamide acid is then cyclised, water being detached. The cyclisation can take place under the influence of heat. The cyclisation is advantageously carried out under the action of dehydrating agents, for example carboxylic acid anhydrides, such as acetic anhydride. The polyimides can then be isolated by customary processes, for example by removal of the solvent or precipitation by addition of a nonsolvent.

A further preparation method comprises reacting the tetracarboxylic acid dianhydride with a diisocyanate in one stage to give the polyimide.

The polyimides according to the invention are soluble in various solvents, if necessary with warming, and they have elevated glass transition temperatures, which can be up to more than 500° C. They are outstandingly suitable for the production of films and protective coatings, in which case coating agents of a solution of the polyimide in a solvent can be used. The present invention furthermore relates to such a coating agent and to the use of the polyimides according to the invention for the production of protective coatings and films.

To produce the coated material according to the invention, the polymer or mixtures thereof are advantageously dissolved in a suitable organic solvent, if necessary with warming. Examples of suitable solvents are polar, aprotic solvents, which can be used by themselves or in mixtures of at least two solvents. Examples are: ethers, such as dibutyl ether, tetrahydrofuran, dioxane, methylene glycol, dimethylethylene glycol, dimethyldiethylene glycol, diethyldiethylene glycol and dimethyltriethylene glycol, halogenated hydrocarbons, such as methylene chloride, chloroform, 1,2-dichloroethane, 1,1,1-trichloroethane and 1,1,2,2-tetrachloroethane, carboxylic acid esters and lactones, such as ethyl acetate, methyl propionate, ethyl benzoate, 2-methoxyethyl acetate, γ-butyrolactone, σ-valerolactone and pivalolactone, carboxylic acid amides and lactams, such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea and hexamethylphosphoric acid amide, sulfoxides, such as dimethylsulfoxide, sulfones, such as dimethyl sulfone, diethyl sulfone, trimethylene sulfone and tetramethylene sulfone, trimethylamine, triethylamine, N-methylpyrrolidine, N-methylpiperidine, N-methylmorpholine and substituted benzenes, such as chlorobenzene, nitrobenzene, phenols or cresols.

Undissolved constituents can be removed by filtration, preferably pressure filtration. The concentration of polymer in the coating agent thus obtained is preferably not more than 50% by weight, in particular not more than 30% by weight and especially not more than 20% by weight, based on the solution.

Other customary additives which do not have an adverse influence on the photosensitivity can be incorporated during preparation of the solutions. Examples of these additives are delustering agents, flow control agents, fineparticled fillers, flameproofing agents, fluorescent brighteners, antioxidants, light stabilisers, stabilisers, dyes, pigments, adhesion promoters and antihalo dyes, for example those described in U.S. Pat. No. 4,349,619.

The coating agent can be applied to suitable substrates or carrier materials by customary methods, such as dipping, brushing and spraying processes or whirler coating, cascade coating and curtain coating. Examples of suitable substrates are plastics, metals and metal alloys, semimetals, semiconductors, glass, ceramics and other inorganic materials, for example $SiO_2$ and $Si_3N_4$. The solvent is then removed, if necessary by warming and if necessary in vacuo. Non-tacky, dry, uniform films are obtained. The films applied can have coating thicknesses of up to about 500 $\mu$m or more, preferably of 0.5 to 500 $\mu$m and in particular 1 to 50 $\mu$m, depending on the use.

It has been found that the polyimides according to the invention are auto-photocrosslinkable and can be crosslinked under the action of radiation if they contain at least 5 mol % of structural elements of the formula I in which Z is a radical of a benzophenonetetracarboxylic acid. Since the photosensitivity increases as the content of such structural elements increases, a content of at least 50 mol %, preferably at least 80 mol % and in particular at least 90 mol %, is advantageous.

Protective films of such polyimides can be further modified by the action of radiation, which means, for example, that increased heat stabilities are possible. There is also the possibility of using such polyimides as a photographic recording material for relief images. As a result of the direct crosslinking under the action of radiation, additives such as sensitisers can be avoided and the protective coatings and images have excellent electrical properties. The protective coatings and images are furthermore distinguished by their high heat stability and by no or only slight shrinkage during exposure to heat, which is of considerable advantage during their use, because virtually no distortion of imaged structures is observed.

The invention furthermore relates to coating agents containing such a radiation-sensitive polyimide in solution, a carrier material coated with such polyimides and the use of this material for the production of protective coatings and photographic relief images. The coating thickness for this use is preferably 0.5 to 100 $\mu$m, in particular 1 to 50 $\mu$m and especially 1–10 $\mu$m.

The photostructuring or photocrosslinking can be brought about by high-energy radiation, for example by light, in particular in the UV range, by X-rays, laser light, electron beams and the like. The material according to the invention is outstandingly suitable for the production of protective films and passivating lacquers and as a photographic recording material for heat-stable relief images.

Examples of fields of use are protective, insulating and passivating lacquers in electrotechnology and electronics, photomasks for electronics, textile printing and the graphics industry, etch resists for the production of printed circuits and printing plates and integrated circuits, relays for the production of X-ray masks, solder-stopping lacquers, dielectrics for multi-layer circuits and structural elements for liquid crystal displays.

Protective films are produced by direct exposure, the exposure times essentially depending on the coating thicknesses and the photosensitivity.

The relief structure is produced photographically by imagewise exposure through a photomask and subsequent development with a solvent or a solvent mixture, the non-exposed portions being removed, after which, if appropriate, the image produced can be stabilised by after-treatment with heat.

The invention furthermore relates to a process of this type for the application of relief structures. Examples of suitable developers are the abovementioned solvents.

The polymer coating on the material according to the invention has a photosensitivity which is sufficient for many intended uses, and in some cases is high, and it can be photocrosslinked directly. The protective films and relief images are distinguished by good adhesion and high stability to heat, mechanical strength and stability to chemicals. Only slight shrinkage is observed during after-treatment with heat. Furthermore, additives to achieve or increase photosensitivity can be avoided. The material is stable on storage, but is advantageously to be protected from the influence of light.

The examples which follow illustrate the invention in more detail.

(A) PREPARATION EXAMPLES

EXAMPLE 1

10.16 g (0.04 mole) of 4,4'-diamino-3,3',5,5'-tetramethyldiphenylmethane are dissolved in 130 ml of N-methylpyrrolidone (NMP) under nitrogen in a cylindrical vessel equipped with a stirrer, dropping funnel, internal thermometer and nitrogen inlet tube, and the solution is cooled to 0° to 5° C. 12.88 g (0.04 mole) of benzophenonetetracarboxylic acid dianhydride (BTDA) are now prepared and are added in portions in the course of 4 hours. 30 minutes after the last addition, 8.9 g (0.09 mole) of triethylamine and 36.7 g (0.36 mole) of acetic anhydride are added dropwise in order to cyclise the resulting polyamide acid to the polyimide. After the solution has been stirred at room temperature for 16 hours, it is poured onto 2 liters of water, with vigorous stirring, and the precipitated product is filtered off. The product is again treated with 2 liters of water and filtered off, and is dried at 80° C. in vacuo. The intrinsic viscosity, measured as a 0.5% solution in NMP at 25° C., is 0.79 dl/g. The glass transition temperature (Tg), measured by differential scanning calorimetry (DSC), is 309° C.

EXAMPLE 2

The procedure followed is as in Example 1, but a mixture of 50 mol % of BTDA and 50 mol % of pyromellitic dianhydride (PMDA) is used. Properties of the resulting copolyimide:
$\eta$=0.75 dl/g;
Tg=403° C.

EXAMPLES 3 TO 26

Various diamines or diamine mixtures are reacted with an equivalent amount of BTDA and the product is then cyclised to the polyimide as described in Example 1. The diamines and the properties of the resulting polyimides are summarised in Table 1.

TABLE 1

| Example | Diamine | | Intrinsic η (dl/g) | Tg (°C.) |
|---|---|---|---|---|
| 3 | 2,3,5,6-tetramethyl-1,4-phenylenediamine (H₂N and NH₂ para; four CH₃ groups) | | 0.92 | 439 |
| 4 | 2,3,5-trimethyl-1,4-phenylenediamine (H₂N and NH₂; three CH₃ groups) | | 0.64 | 408 |
| 5 | [H₂N—C₆H₃—CH₂—]₂ (bis aminophenyl methane) | | 0.70 | 310 |
| 6 | [H₂N—C₆H₂(CH₃)₂—C(=O)—]₂ | | 0.25 | 326 |
| 7 | [H₂N—C₆H₂(C₂H₅)₂—CH₂—]₂ | | 0.51 | 260 |
| 8 | [H₂N—C₆H₂(R)₂—CH₂—]₂  R = —CH(CH₃)₂ | | 0.56 | 283 |
| 9 | Diamine of Example 1 Diamine of Example 3 | (50 mol %) (50 mol %) | 0.76 | 377 |
| 10 | Diamine of Example 7 Diamine of Example 3 | (50 mol %) (50 mol %) | 0.62 | 323 |

TABLE 1-continued

| Example | Diamine | | Intrinsic η (dl/g) | Tg (°C.) |
|---|---|---|---|---|
| 11 | ⟨H$_2$N—(2,6-CH$_3$,C$_2$H$_5$-C$_6$H$_2$)—CH$_2$⟩$_2$ | (50 mol %) | 0.78 | 364 |
| | Diamine of Example 3 | (50 mol %) | | |
| 12 | 1,3-diamino-2,4,5,6-tetramethylbenzene (H$_2$N, CH$_3$, NH$_2$, H$_3$C, CH$_3$, CH$_3$) | | 0.592 | 429 |
| 13 | ⟨H$_2$N—(2,3,5,6-tetramethylphenyl)—CH$_2$⟩$_2$ | | 0.773 | 392 |
| 14 | 4,6-diethyl-2-methyl-1,3-phenylenediamine | | 0.606 | 390 |
| 15 | 2,6-dimethyl-1,3-phenylenediamine type (NH$_2$, H$_3$C, CH$_3$, NH$_2$) | | 0.438 | 386 |
| 16 | 3,6-Diaminodurene | (70 mol %) | 0.705 | 276 |
| | ⟨H$_2$N—(CH$_2$)$_3$—Si(CH$_3$)$_2$—O⟩$_2$ | (30 mol %) | | |
| 17 | 3,6-Diaminodurene | (87.2 mol %) | 0.525 | 342 |
| | H$_2$N—(CH$_2$)$_3$—[Si(CH$_3$)$_2$—O]$_{3.2}$—Si(CH$_3$)$_2$—(CH$_2$)$_3$—NH$_2$ | (12.8 mol %) | | |
| 18 | 3,6-Diaminodurene | (70 mol %) | 0.441 | 305 |

TABLE 1-continued
| Example | Diamine | | Intrinsic η (dl/g) | Tg (°C.) |
|---|---|---|---|---|
| | 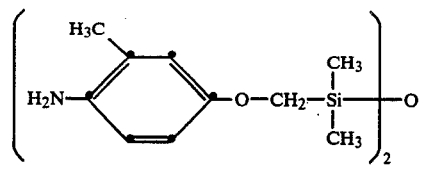 | (30 mol %) | | |
| 19[1] | 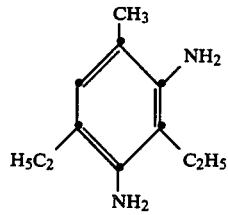 | (80 mol %) | 0.48 | 329 |
| | H₂N—(CH₂)₆—NH₂ | (20 mol %) | | |
| 20[1] | 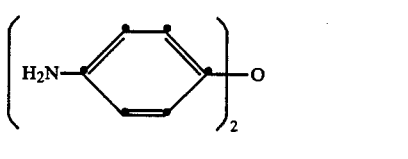 | (90 mol %) | 0.534 | 386 |
| | 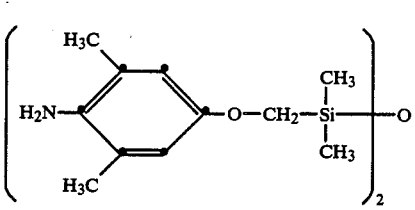 | (10 mol %) | | |
| 21 | 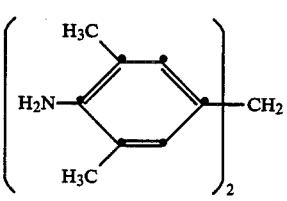 | | 0.08 | 130 |
| 22 | 3,6-Diaminodurene<br>Diamine from Example 21 | (90 mol %)<br>(10 mol %) | 0.397 | 377 |
| 23 |  | | 0.189 | 154 |
| 24 |  | (60 mol %) | 0.303 | 230 |
| | Diamine from Example 23 | (40 mol %) | | |

TABLE 1-continued

| Example | Diamine | | Intrinsic η (dl/g) | Tg (°C.) |
|---|---|---|---|---|
| 25 | 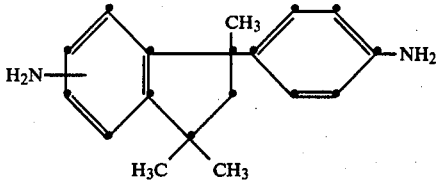 | (80 mol %) | 0.60 | 333 |
|  | 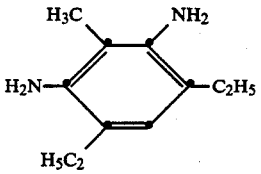 | (20 mol %) | | |
| 26 | 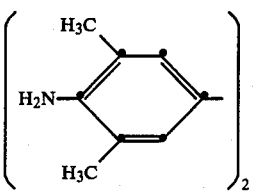 | (20 mol %) | 0.425 | 378 |
|  | 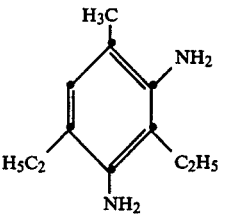 | (80 mol %) | | |

[1] 10 mol % of BTDA replaced by PMDA

EXAMPLE 27

4.89 g (0.017 mole) of 4,4'-diamino-3,3'-dimethyl-5,5'-diethyldiphenylmethane are reacted with 5.57 g of BTDA in 42 ml of NMP in the apparatus described in Example 1. After 2 hours, the temperature is increased to 50° C. After one hour, 55.7 mg of BTDA are added and the mixture is stirred at 50° C. for a further 3 hours. After a further 55.7 mg of BTDA have been added, stirring is again continued at 50° C. for 2 hours. After the mixture has been cooled to room temperature, 5.5 ml of triethylamine and 15 ml of acetic anhydride are added and the mixture is stirred overnight at room temperature. The following day, the polymer is precipitated by stirring the mixture into water and is filtered off and dried. Properties:

η=0.70 dl/g;
Tg=282° C.

EXAMPLES 28-34

Diamines or diamine mixtures are reacted with an equivalent amount of pyromellitic dianhydride and the product is then cyclised to the polyimide, as described in Example 1. The diamines and the properties of the polyimides are summarised in Table 2.

EXAMPLES 35 AND 36

Diamines are reacted with an equivalent amount of 4,4'-methylenediphthalic anhydride and the product is then cyclised to the polyimide, as described in Example 1. The diamines and the properties of the polyimides are summarised in Table 2.

TABLE 2

| Example | Diamine | Intrinsic η(dl/g) | Tg (°C.) |
|---|---|---|---|
| 28 | 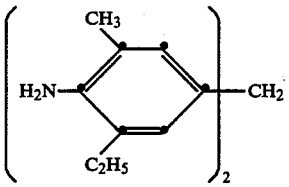 (50 mol %) 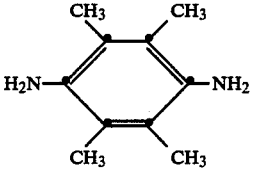 (25 mol %) 2,4-Toluenediamine (25 mol %) | 0.75 | 437 |

TABLE 2-continued

| Example | Diamine | Intrinsic η(dl/g) | Tg (°C.) |
|---|---|---|---|
| 29 | (structure: H₂N—C₆H(CH₃)(C₂H₅)—CH₂—)₂ (60 mol %) and H₂N—C₆H(CH₃)₂—NH₂ with CH₃ (40 mol %) | 0.83 | 513 |
| 30 | (H₂N—bicyclic—CH₂—)₂ | —(1) | 375 |
| 31 | As Example 30 (70 mol %) | 1.002 | 423 |
| | H₂N—C₆(CH₃)₃—NH₃ (30 mol %) | | |
| 32 | As Example 1 (40 mol %) | —(1) | 494 |
| | H₂N—C₆H(CH₃)₃—NH₂ (30 mol %) | | |
| | H₂N—C₆(CH)(CH₃)₃—NH₂ (30 mol %) | | |
| 33 | As Example 30 (70 mol %) | 0.868 | 425 |
| | 2,4-Toluenediamine (30 mol %) | | |
| 34 | H₂N—C₆H(C₂H₅)(NH₃)(C₂H₅)(CH₃)— | 0.576 | >500* |
| 35 | (H₂N—C₆H(CH₃)₂—CH₂—)₂ | 0.352 | 281 |
| 36 | As Example 30 | 0.596 | 319 |

*Melting point range 490° C.
(1)not determined

(B) USE EXAMPLES

A thin polymer film is produced on a sheet of plastic, which is laminated with copper on one side, by whirling on a 5% polymer solution and then removing the solvent in a circulating air oven. N-Methylpyrrolidone is used as the solvent.

The sheets thus coated are exposed through a photomask (Stouffer wedge) at room temperature using a 1,000 watt UV lamp at a distance of 18 cm. The exposed sheets are then developed with a solvent, the non-exposed portions of the polymer film being dissolved away. The relief image is then revealed by etching away the exposed copper layer with FeCl₃ solution.

The exposure time, the developer used and the photosensitivity (21-step Stouffer sensitivity guide) are summarised in Table 3. MEK is methyl ethyl ketone.

TABLE 3

| Polymer according to Example | Exposure time (seconds) | Developer | Sensitivity (Stouffer scale) |
|---|---|---|---|
| 1 | 10 | NMP | 6 |
| 2 | 40 | NMP | 7 |
| 3 | 20 | NMP | 7–8 |
| 4 | 10 | NMP | 5 |
| 5 | 10 | NMP | 6–7 |
| 6 | 120 | NMP | 9–10 |
| 7 | 4 | NMP | 6 |
| 8 | 10 | NMP | 9 |
| 9 | 5 | NMP | 7 |
| 10 | 4 | NMP | 6 |
| 11 | 15 | NMP | 8–9 |
| 12 | 15 | NMP | 6 |
| 13 | 6 | NMP | 6 |
| 14 | 10 | NMP | 7 |
| 15 | 120 | NMP | 5 |
| 16 | 30 | NMP | 8 |
| 17 | 30 | NMP | 6 |
| 18 | 240 | CHCl₃ | 5 |
| 19 | 120 | NMP | 6 |
| 20 | 130 | NMP | 5 |
| 21 | 600 | Toluene | 3 |
| 22 | 120 | NMP | 8 |
| 23 | 600 | Toluene | 6–7 |
| 24 | 240 | NMP | 6–7 |
| 25 | 600 | CHCl₃ | 2 |
| 26 | 120 | NMP | 5–6 |
| 27 | 2.5 | NMP/MEK (1:2) | 6 |

What is claimed is:

1. A homopolyimide or copolyimide of at least one aromatic tetracarboxylic acid and at least one aromatic diamine, which essentially consists of 5 to 100 mol % of at least one structural element of the formula I

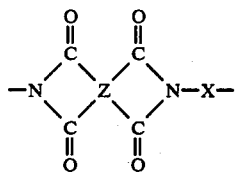

and 95–0 mol % of at least one structural element of the formula II

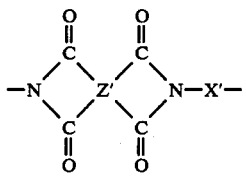

wherein Z is an unsubstituted tetravalent aromatic radical to which in each case two carbonyl groups are bonded in the ortho- or peri-position, X is the divalent radical of an aromatic diamine, Z' has the same meaning as Z, or is a different tetravalent organic radical to Z, and X' is the divalent radical of an organic diamine which differs from X, wherein the aromatic radical of X is substituted in the two ortho-positions relative to at least one N atom by alkyl, cycloalkyl, alkoxy, alkoxyalkyl or aralkyl, or wherein two adjacent C atoms of the aromatic radical are substituted by alkylene.

2. A polyimide according to claim 1, in which an aromatic radical X is a divalent, mononuclear or dinuclear phenylene radical.

3. A polyimide according to claim 1, in which the alkyl or alkoxy substituent of X contains 1 to 20 C atoms, the alkoxyalkyl substituent of X contains 2 to 12 C atoms, the cycloalkyl substituent of X contains 5 or 6 ring carbon atoms, the alkylene substituent of X contains 3 or 4 C atoms and the aralkyl substituent of X is benzyl.

4. A polyimide according to claim 3, in which the substituent is alkyl with 1 to 4 C atoms.

5. A polyimide according to claim 1, in which an aromatic radical Z or Z' contains 6 to 30 C atoms.

6. A polyimide according to claim 1, in which Z and Z' are

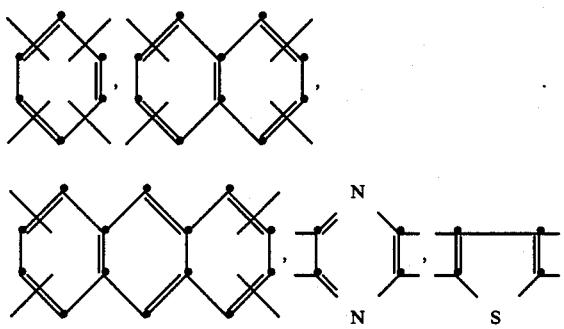

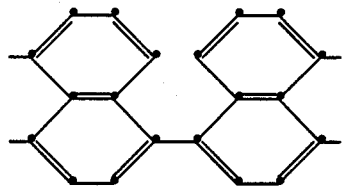

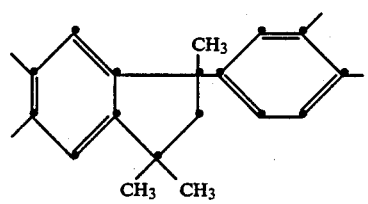

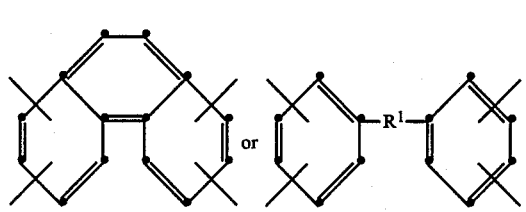

in which $R^1$ is a direct bond or a bridge group of the formula

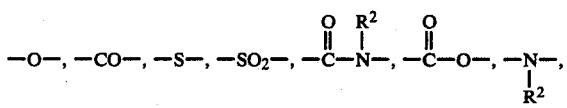

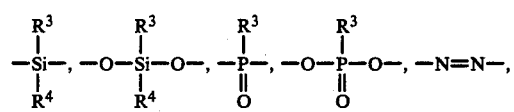

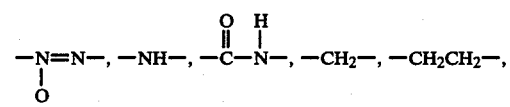

in which $R^2$, $R^3$ and $R^4$ are alkyl with 1 to 6 C atoms, phenyl or benzyl, and $R^3$ and $R^4$ are also alkoxy with 1 to 6 C atoms, phenoxy or benzyloxy.

7. A polyimide according to claim 6, in which Z and Z' are radicals of the formulae

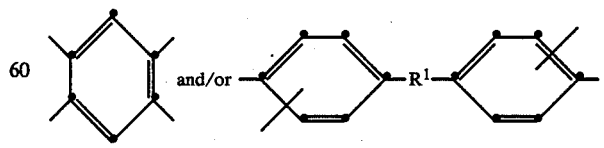

in which $R^1$ is a direct bond, —O—, —SO$_2$—, —CH$_2$— or, —CO—.

8. A polyimide according to claim 7, in which Z and Z' are radicals of the formulae

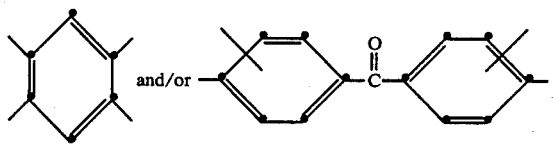

or mixtures thereof.

9. A polyimide according to claim 1, in which an aromatic radical X has the formulae III, IIIa and/or IIIb

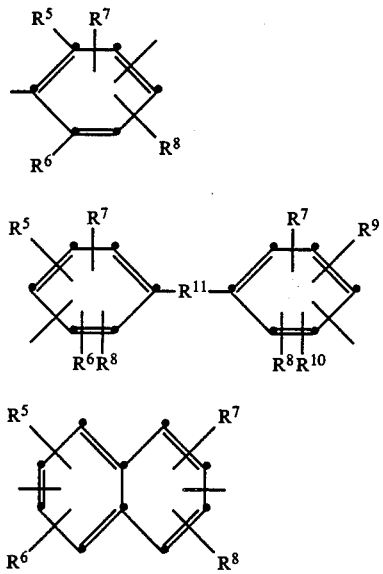

in which, in formula III, the free bonds are in the meta- or para-position relative to one another, in formula IIIa the free bonds are preferably in the meta- or para-position relative to the $R^{11}$ group and $R^5$ and $R^6$ are bonded in the two ortho-positions of the free bond, and in formula IIIb the free bonds are in the 2-, 3-, 6- or 7-positions and $R^5$ and $R^6$ are in the two ortho-positions of the free bonds, $R^{11}$ is a direct bond, —O—, —S—, —SS—, —SO—, —SO$_2$—, —CO—, —COO—, —NH—,

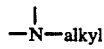

with 1 to 6 C atoms in the alkyl,

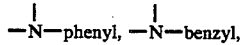

—CONH—, —CON—alkyl— with 1 to 6 C atoms in the alkyl, —CON—phenyl—, —CON—benzyl—,

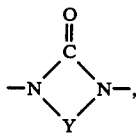

in which Y is

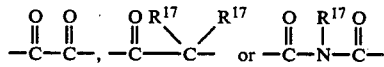

and $R^{17}$ is a hydrogen atom, $C_1$-$C_6$-alkyl or phenyl, linear or branched alkylene with 1 to 3 C atoms, alkylidene which has 2 to 12 C atoms and is unsubstituted or substituted by Cl or F, cycloalkylidene with 5 or 6 ring carbon atoms, phenylene, phenylenedioxy or the group

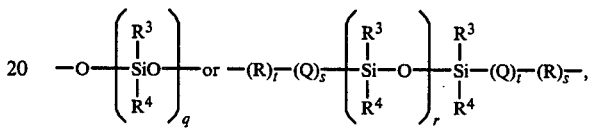

in which $R^3$ and $R^4$ are alkyl or alkoxy with 1 to 6 C atoms, phenyl, benzyl, phenoxy or benzyloxy, r is a number from 1 to 10, t is 0 or 1, s is 0 or 1, R is —O— or —S—, Q is $C_1$-$C_6$-alkylene and q is a number from 1 to 100, $R^5$ and $R^6$ are alkyl or alkoxy with 1 to 12 C atoms, alkoxyalkyl with 2 to 12 C atoms, cyclopentyl, cyclohexyl or benzyl, or, in the formula III or IIIa, $R^5$ and $R^7$ are bonded in adjacent positions and together are trimethylene are tetramethylene, in which case $R^6$ can also be a hydrogen atom, or $R^7$ and $R^8$ are hydrogen atoms or independently have the meanings of $R^5$ and $R^6$, and $R^9$ and $R^{10}$ are hydrogen atoms or independently have the meanings of $R^5$ and $R^6$, or $R^7$ and $R^9$ in formula IIIa together are trimethylene or tetramethylene.

10. A polyimide according to claim 9, in which $R^5$ and $R^6$ are alkyl with 1 to 6 C atoms.

11. A polyimide according to claim 9, in which $R^{11}$ is —CH$_2$—, —O—, —CO— or a direct bond.

12. A polyimide according to claim 9, in which the free bonds in formula IIIa are in the para-position relative to the $R^{11}$ group.

13. A polyimide according to claim 1, which contains 2 to 4, different structural elements of formula I and II.

14. A polyimide according to claim 13, in which the structural elements of the formula I differ in the radical X.

15. A polyimide according to claim 9, in which X in formula I is a radical of the formula

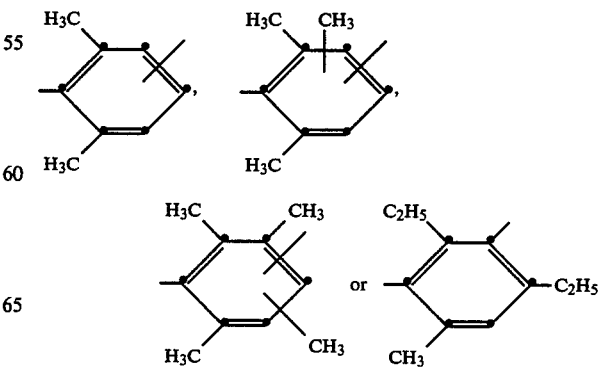

in which the free bonds are in the meta- or para-position relative to one another, or of the formula

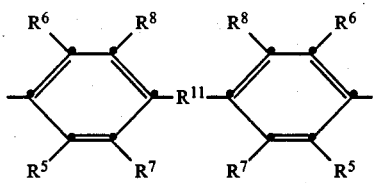

in which $R^5$ and $R^6$ independently of one another are methyl, ethyl, n-propyl or isopropyl, $R^7$ and $R^8$ are hydrogen atoms or have the meaning of $R^5$, or $R^5$ and $R^7$ together are trimethylene or tetramethylene and $R^6$ and $R^8$ are hydrogen atoms, and $R^{11}$ is a direct bond, $CH_2$ or CO.

16. A polyimide according to claim 15, which is a copolyimide with two or more radicals of the formulae

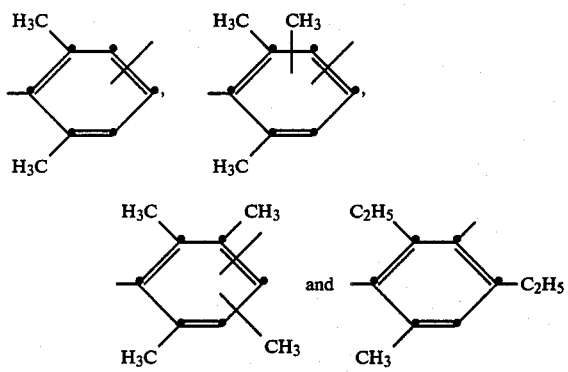

in which the free bonds are in the meta- or para-position relative to one another, or of the formula

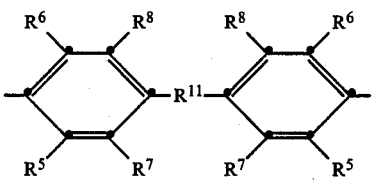

in which $R^5$, $R^6$, $R^7$ and $R^{11}$ are as defined in claim 15.

17. A polyimide according to claim 1, in which X' in formula II is alkylene with 2 to 30 C atoms, cycloalkylene with 5 to 8 ring carbon atoms, aralkylene with 7 to 30 C atoms, arylene with 6 to 22 C atoms or a polysiloxane radical.

18. A polyimide according to claim 17, in which an arylene radical X' has the formula IV

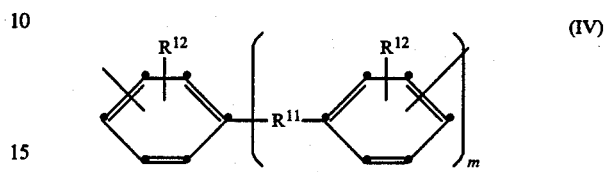

(IV)

in which m is 0 or 1, the free bonds are in the meta-position or, the ortho-position relative to the $R^{12}$ group, $R^{11}$ is as defined in formula IIIa and $R^{12}$ has the same meaning as $R^5$.

19. A polyimide according to claim 18, in which X' has the formula IVa, IVb and/or IVc

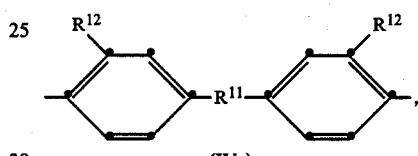

(IVa)

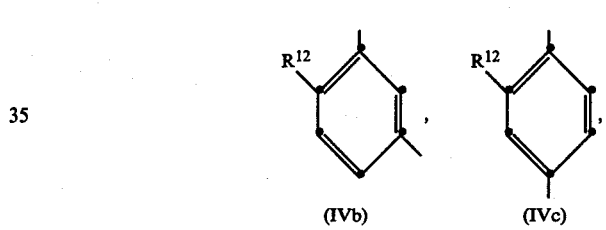

(IVb)        (IVc)

in which $R^{11}$ is a direct bond, —O—, —CO— or —$CH_2$— and $R^{12}$ is methyl, ethyl, isopropyl, methoxy, ethoxy or a hydrogen atom.

20. A polyimide according to claim 1, which contains 20–100 mol % of structural elements of the formula I and 80–0 mol % of structural elements of the formula II.

21. A polyimide according to claim 1, which consists of recurring structural elements of the formula

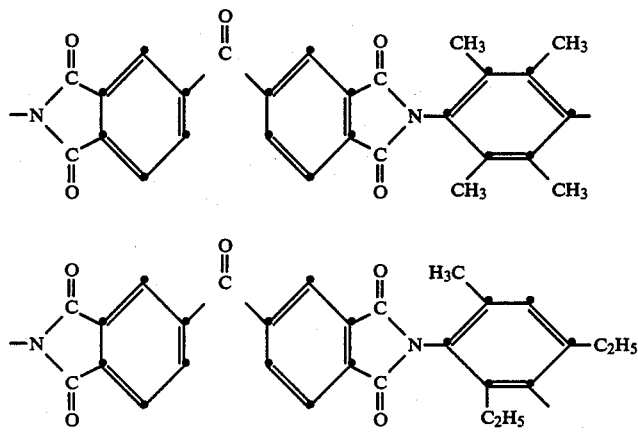

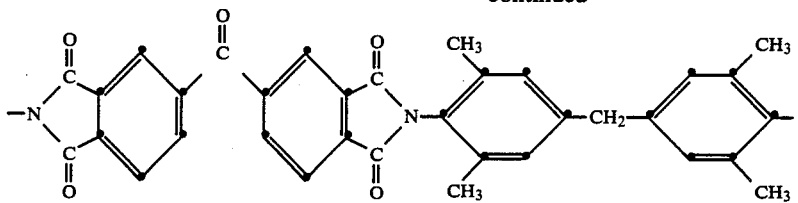

or

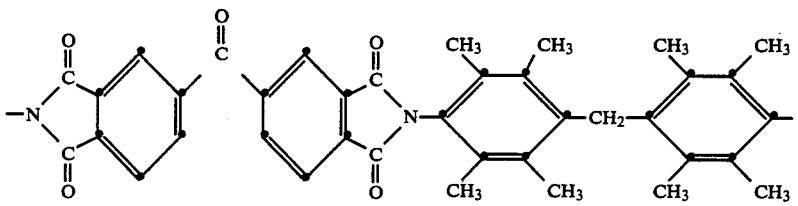

or mixtures of such structural elements.

22. A process for the preparation of polyimides according to claim 1, which comprises subjecting at least one tetracarboxylic acid of the formula V

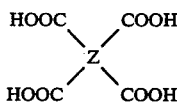 (V)

by itself or together with at least one tetracarboxylic acid of the formula Va, or polyimide-forming derivatives thereof,

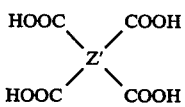 (Va)

to a polycondensation reaction with at least 5 mol %, based on the diamines, of at least one diamine of the formula VI $H_2N—X—NH_2$ (VI)

by itself or together with at most 95 mol % of at least one diamine of the formula VIa $H_2N—X'—NH_2$ (VIa)

and then cyclizing the formed polyamide acid under the influence of heat/or the action of dehydrating agents.

23. A coated material consisting of a carrier material onto which a coating of a polyimide according to claim 1 is applied.

24. A process for the production of a protective film, which comprises irradiating a coated material according to claim 22, in which the polyimide contains at least 5 mol % of benzophenonetetracarboxylic acid radicals, based on the tetracarboxylic acids, over the entire area, to produce a protective coating.

25. A polyimide according to claim 4 in which the substituent is isopropyl, ethyl or methyl.

26. A polyimide according to claim 10 in which the substituent is methyl, ethyl, n-propyl or isopropyl.

27. A material having a protective film coating produced by the process according to claim 24.

28. A process for the production of a photographic relief image which comprises irradiating a coated material according to claim 22, in which the polyimide contains at least 5 mol % of benzophenonetetracarboxylic acid radicals, based on the tetracarboxylic acids, under a mask and then removing the non-exposed portions with a developer.

29. A photographic relief image produced by the process according to claim 28.

* * * * *

UNITED STATES PATENT AND TRADEMARK OFFICE
CERTIFICATE OF CORRECTION

PATENT NO. : 4,629,777

DATED : DECEMBER 16, 1986

INVENTOR(S) : JOSEF PFEIFER

It is certified that error appears in the above-identified patent and that said Letters Patent is hereby corrected as shown below:

Column 36, Claim 24, lines 2-3 should read -- according to claim 23 --.

Column 36, Claim 28, line 3 should read -- according to claim 23 --.

Signed and Sealed this

Fifteenth Day of September, 1987

Attest:

DONALD J. QUIGG

*Attesting Officer*   *Commissioner of Patents and Trademarks*